United States Patent
Veau et al.

(10) Patent No.: US 8,385,563 B2
(45) Date of Patent: Feb. 26, 2013

(54) SOUND LEVEL CONTROL IN RESPONDING TO THE ESTIMATED IMPEDANCES INDICATING THAT THE MEDIUM BEING AN AUDITORY CANAL AND OTHER THAN THE AUDITORY CANAL

(75) Inventors: Nicolas Veau, Le Rouret (FR); Laurent Le Faucheur, Antibes (FR)

(73) Assignee: Texas Instruments Incorporated, Dallas, TX (US)

( * ) Notice: Subject to any disclaimer, the term of this patent is extended or adjusted under 35 U.S.C. 154(b) by 819 days.

(21) Appl. No.: 12/367,232

(22) Filed: Feb. 6, 2009

(65) Prior Publication Data

US 2010/0046772 A1    Feb. 25, 2010

(30) Foreign Application Priority Data

Aug. 21, 2008    (EP) ..................... 08290795

(51) Int. Cl.
*H03G 3/00* (2006.01)
*H03G 5/00* (2006.01)
(52) U.S. Cl. ....................... 381/103; 381/107
(58) Field of Classification Search .................. 381/103, 381/107
See application file for complete search history.

(56) References Cited

U.S. PATENT DOCUMENTS

| | | | | |
|---|---|---|---|---|
| 5,014,056 | A | * | 5/1991 | Moriwaki ...................... 341/161 |
| 5,808,575 | A | * | 9/1998 | Himeno et al. ................ 341/139 |
| 2007/0030983 | A1 | * | 2/2007 | Aarts ............................... 381/97 |

OTHER PUBLICATIONS

Roos, Gina, "Agilent's new proximity sensor beats the fumble-fingered competition hands down . . . literally," eeProductCenter.com, 3 pages, Found at: http://www.eeproductcenter.com/passives/review/showArticle.jhtml?articleID=46200544, Sep. 1, 2004.

* cited by examiner

*Primary Examiner* — Thanh V Pham

(74) *Attorney, Agent, or Firm* — Michael A. Davis, Jr.; W. James Brady; Frederick J. Telecky, Jr.

(57) ABSTRACT

A system and method for controlling a sound level of a mobile audio device are disclosed herein. In accordance with at least some embodiments, a system includes a transducer, a phase estimator, and a sound level control. The transducer converts an electrical signal applied to the transducer into audible sound. The phase estimator estimates a phase difference between a voltage and a current of the electrical signal applied to the transducer. The sound level control controls the loudness of sound produced by the transducer based, at least in part on the estimated phase difference.

19 Claims, 4 Drawing Sheets

SOUND LEVEL CONTROL IN RESPONDING TO THE ESTIMATED IMPEDANCES INDICATING THAT THE MEDIUM BEING AN AUDITORY CANAL AND OTHER THAN THE AUDITORY CANAL

The present application claims priority to and incorporates by reference European patent application No. 08290795.7, filed on Aug. 21, 2008.

BACKGROUND

The deleterious effects of excessive exposure to high sound levels have been long known. Hearing loss or impairment caused by such exposure may be irreversible in some cases. Fortunately, damage to hearing can be prevented, to a great extent, by reducing exposure to harmful sound levels and limiting the time period over which a potentially harmful exposure occurs.

In the past, exposure to excessive sound levels in the workplace has been considered a significant cause of hearing impairment. Consequently, various regulatory measures have been enacted to protect workers from dangerous levels of sound. More recently, however, the harmful effects of exposure to high sound levels outside the workplace have become apparent.

Mobile audio devices are a ubiquitous fixture of modern society. Cellular telephones, personal music players, portable gaming systems, etc. can generate audio signals at potentially damaging levels. Mobile audio device are often employed for hours each day. Users often employ such devices at sound levels that can lead to hearing impairment. For example, users of personal music players may unknowingly set device volume to produce detrimental sound levels. In some cases, the presence of background noise levels, e.g., while driving, may cause a user to increase the output volume of the device to a dangerously high level.

Regulations limiting the output sound level of mobile devices are becoming increasingly common. Some regulations may, for example, require a portable device to limit its output sound level to a maximum of 100 decibels, 94 decibels etc. Systems that automatically protect mobile equipment users from harmful sound levels are desirable.

SUMMARY

Various systems and methods for controlling a sound level of a mobile audio device are disclosed herein. In accordance with at least some embodiments, a system includes a transducer, a phase estimator, and a sound level control. The transducer converts an electrical signal applied to the transducer into audible sound. The phase estimator estimates a phase difference between a voltage and a current of the electrical signal applied to the transducer. The sound level control controls the loudness of sound produced by the transducer based, at least in part on the estimated phase difference.

In accordance with at least some other embodiments, a method includes determining a phase difference between a voltage and current of an electrical signal driving a speaker. Loudness of a sound produced by the speaker is adjusted based, at least in part, on the phase difference.

In accordance with yet other embodiments, a mobile audio device includes an audio volume control system. The audio volume control system adjusts audio output volume based, at least in part, on a distance between an audio speaker and an auditory canal of a user.

BRIEF DESCRIPTION OF THE DRAWINGS

For a detailed description of exemplary embodiments of the invention, reference will now be made to the accompanying drawings in which.

NOTATION AND NOMENCLATURE

Figure 1A:
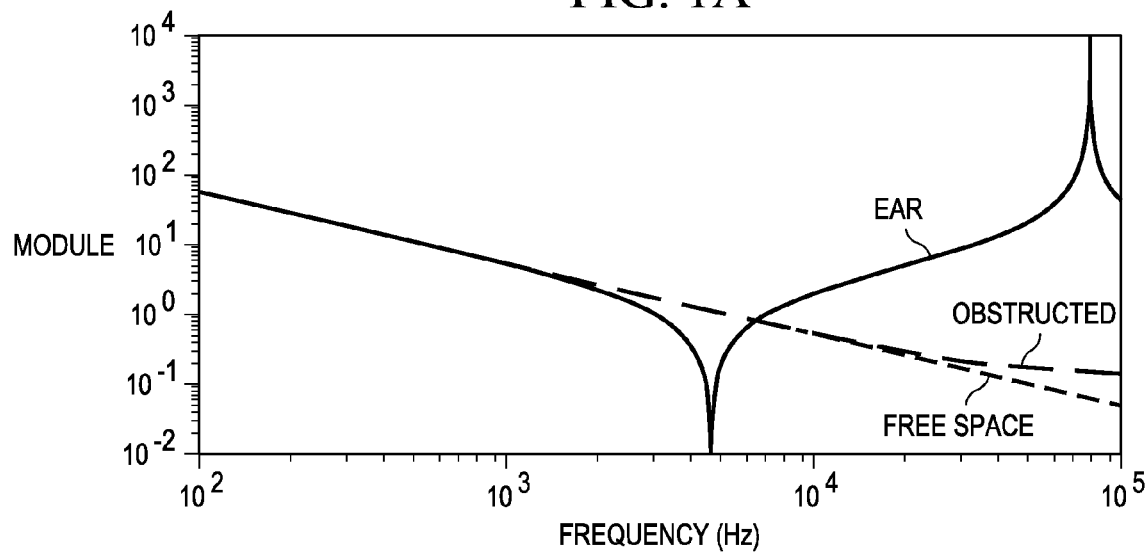
FIG. 1A shows speaker voltage to speaker current amplitude ratio variance across frequency for a speaker obstructed, acoustically coupled to free space, or acoustically coupled to the ear of a user in accordance with various embodiments.

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection. Further, the term "software" includes any executable code capable of running on a processor, regardless of the media used to store the software. Thus, code stored in memory (e.g., non-volatile memory), and sometimes referred to as "embedded firmware," is included within the definition of software.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Disclosed herein are a system and method for controlling the loudness of sound output by a mobile audio device. To prevent damage to the hearing of mobile audio device users, various government regulations are being enacted to limit mobile audio device sound output. The European Standard EN 50332-2:200, entitled "Sound system equipment: Headphones and earphones associated with portable audio equipment—Maximum sound pressure level measurement methodology and limit considerations—" is one example of such a regulation. EN 50332 specifies a maximum sound pressure level and electrical output for mobile audio devices, including headphones and earphones associated with the players. One method of limiting sound level output from a portable device involves limiting speaker output power to a maximum value under all conditions. For example, speaker drive may be limited to produce a maximum sound pressure with in-ear headphones. The limitation is applied to all listening conditions. While effectively limiting sound pressure level, such a solution is fails to account for varying sound pressure levels that result from different positioning of the speaker relative to the user's ear. For example, the sound pressure level experienced by a user differs based on the distance between the user's ear and a speaker.

Embodiments of the present disclosure perform acoustic impedance measurements to provide the mobile audio device with information pertaining to the loudspeaker's operational environment. The mobile audio device can adjust its sound output level base on the acoustic impedance measurements. Thus, embodiments can automatically reduce the sound pressure level under conditions indicative of close acoustic coupling between the speaker and a user's ear.

Acoustic impedance is a property of a sound conducting medium. Acoustic impedance depends on the geometry, stiffness, and density of the medium. Embodiments of the present disclosure measure the acoustic impedance in the near-field of a mobile audio device's loudspeaker. The measured acoustic impedance describes some characteristics of the loudspeaker's environment. Understanding the loudspeaker's environment allows embodiments to intelligently adjust the device's output sound level.

The acoustic impedance measurements performed by embodiments of the present disclosure are preferably based on a model of a system extending from the electrical inputs of the mobile audio device's loudspeaker and the ear of the user. The system can be referred to as the "ear-speaker system." The model preferably estimates various parameters of the acoustic impedance of the medium surrounding the loudspeaker with regard to current drawn by the speaker and voltage at the speaker inputs.

Embodiments limit the acoustic medium modeled to three physical configurations representing positions of the loudspeaker relative to the user's ear. Embodiments provide discriminating parameters relevant to each physical configuration.

The "Free Space" configuration occurs when the user's ear is not in contact with the loudspeaker, and the loudspeaker sees the acoustic impedance of air. Temperature, moisture, and pressure are considered constant. Acoustic impedance in the free space configuration can be defined as:

$$Z_o = 430 \text{ Pa·s/m}^3. \quad (1)$$

The "Blocked" or "obstructed" configuration occurs when the loudspeaker is in contact with the user's skin, and the loudspeaker sees the acoustic impedance of water. Acoustic impedance in the blocked configuration can be defined as:

$$Z_c = 1.5 \times 10^6 \text{ Pa·s/m}^3. \quad (2)$$

The Ear/Loudspeaker aligned ("ear aligned") configuration occurs when the ear of the user is just in front of the loudspeaker and the loudspeaker sees the acoustic impedance of the ear. The ear is modeled as a small tube (i.e., the auditory canal) entering a cavity. The length of the tube ("$l_{tube}$") is approximately one centimeter ("cm"), and the radius of the tube ("$a_{tube}$") is approximately 3 millimeters ("mm"). An acoustic wavelength can be approximately 4 cm. Thus, $l_{tube}$ and $a_{tube}$ are within the same order of magnitude as the wavelength. The effect of acoustic resistance $R_A$ is insignificant. The inner ear cavity volume is approximately, $10^{-5} \text{m}^3$, resulting in a maximum transmission at about 4 KHz. The acoustic impedance in the ear aligned configuration can be expressed as:

$$Z_A(\omega) = R_A + i\omega M_A + \frac{1}{i\omega C_A} \text{ Pa·s/m}^3, \quad (3)$$

where: $R_A$ is acoustic resistance, defined as $R_A = 0 \text{ Pa·s/m}^3$, $M_A$ is acoustic mass, defined as $$M_A = \frac{\rho_0 l_{tube}}{a_{tube}^2 \pi} = \frac{(1.18)(0.01)}{0.003^2 \pi} \text{ kg/m}^4,$$

with $\rho_0$ representing air density, and $C_A$ is acoustic compliance, defined as $$C_A = \frac{V_{cavity}}{\gamma P_0} = \frac{10^{-5}}{1.4 \times 10^5} \text{ Pa/m}^3,$$

with $V_{cavity}$ representing the volume of the tube between the loudspeaker and the eardrum, $\gamma$ representing the ratio of specific heat which expresses variation of density with temperature; and $P_0$ representing acoustic pressure (1 atmosphere=$10^5$ Pascal).

Thus, by resolving $R_A$, $M_A$, and $C_A$ embodiments determine the geometrical characteristics of the user's ear.

The loudspeaker is an electro-mechanical system comprising an electrical-mechanical transformer, and a mechanical-acoustic transformer. The mechanical portion transforms the displacement and velocity of the speaker membrane into pressure and velocity of the air resulting in sound propagation, and can be modeled as:

$$Z_M(\omega, Z_{user}) = Z_{user} S^2 + \frac{1}{i\omega C_M}. \quad (4)$$

$C_M$ is comparable to spring stiffness, and its value is preferably computed to obtain maximum energy transfer at 4 KHz, thus, $C_M = 3 \times 10^{-5}$ m/N. The loudspeaker surface is, for example, $S = 0.01^2(\pi)\text{m}^2$ for a 0.01 m speaker radius.

The electrical portion transforms speaker current and speaker voltage into displacement and velocity of the speaker membrane, and can be modeled as:

$$Z_E(\omega, Z_M) = \cfrac{1}{i\omega C_E + \cfrac{1}{T_{ES}Z_M}}, \quad (5)$$

where: $C_E = 10^{-7}$ Farads and $T_{ES} = 1$.

The complete speaker-ear model is expressed as:

$$Z_E(\omega) = \cfrac{1}{i\omega C_E + \cfrac{1}{T_{ES}\left(R_A + i\omega M_A + \cfrac{1}{i\omega C_A}\right)S^2 + \cfrac{1}{i\omega C_M}}} \quad (6)$$

Figure 1B:
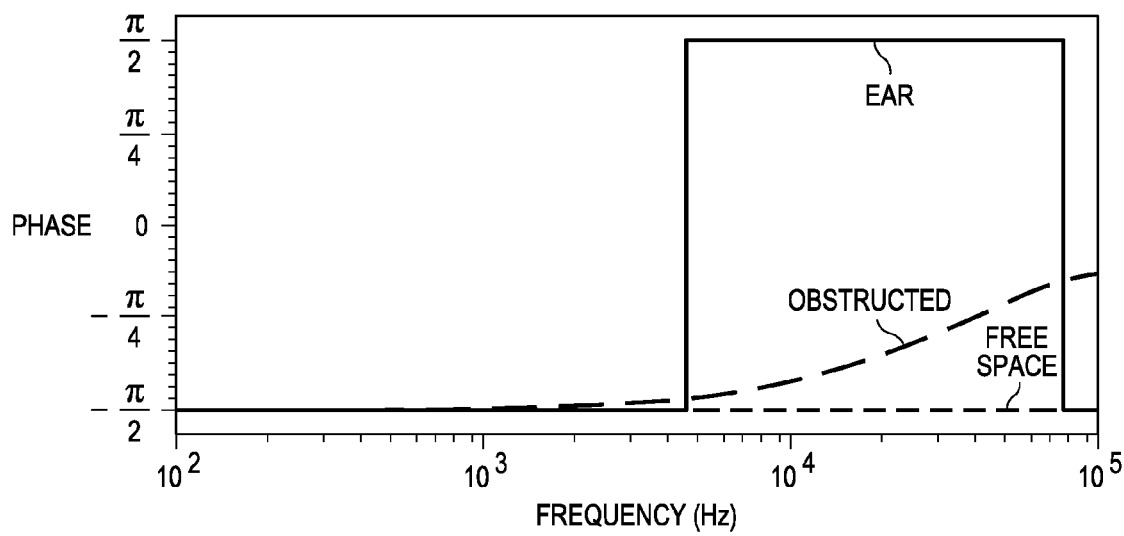
FIG. 1B shows speaker voltage to speaker current phase variance across frequency for a speaker obstructed, acoustically coupled to free space, or acoustically coupled to the ear of a user in accordance with various embodiments.

FIGS. 1A and 1B respectively show speaker voltage to current amplitude ratio and phase variance across frequency for a speaker obstructed, acoustically coupled to free space, or acoustically coupled to the ear of a user in accordance with various embodiments. Below 2 KHz the voltage to current amplitude ratio, shown in FIG. 1A, is decreasing with frequency, but does not change with the external acoustic impedance. Above 6 KHz, the voltage to current amplitude ratio increases for the ear and decreases for an obstructed speaker or a speaker acoustically coupled to free space. Some embodiments use these properties to discriminate between an ear and an obstructed speaker or an ear and free space.

Referring to FIG. 1B, at frequencies below 2 KHz the phase difference between the speaker voltage and current is not significant, but above 5 KHz, the phase difference allows embodiments to discriminate between the obstructed environment and an ear or an obstructed speaker and free space. By applying the responses shown in FIGS. 1A and/or 1B, embodiments can discriminate between ear aligned, obstructed and free space configurations.

Figure 2:
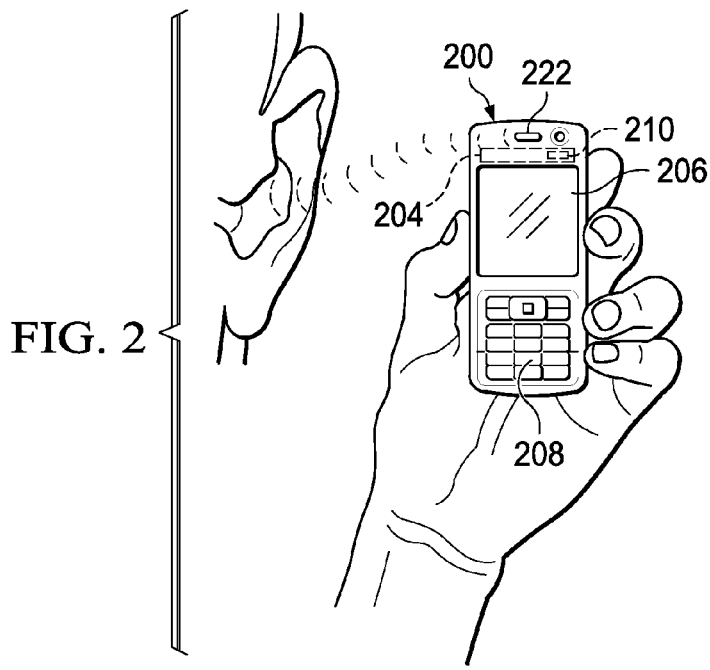
FIG. 2 shows an exemplary mobile audio device 200 that that controls output sound pressure level in accordance with various embodiments.

FIG. 2 shows an exemplary mobile audio device 200 that that controls output sound pressure level in accordance with various embodiments. The mobile audio device 200 includes a loudspeaker 222, and audio circuitry 204. Embodiments of the mobile audio device can also include a display 206 (e.g., liquid crystal display, organic light emitting diode display, etc.), a keypad or touchpad 208 (overlaying the display in some embodiments), radio frequency circuitry, processors, memory, antennas, etc.

The audio circuitry 204 provides electrical signals to the loudspeaker 222. The loudspeaker 222 converts the electrical signals into audible sound that the user can hear. To protect the user from hearing damage caused by exposure to excessively high levels of sound pressure, the audio circuitry 204 includes loudness control circuitry 210 that limits the sound pressure level in accordance with the estimated acoustic impedance of a medium acoustically coupled to the speaker 222. In some embodiments, the loudness control circuitry estimates the acoustic impedance of the medium acoustically coupled to the speaker 222, in accordance with the free space, blocked and ear aligned acoustic impedance conditions explained above. Embodiments preferable determine the presence of these conditions based, at least in part, on an estimation of difference in phase of the voltage and current of the electrical signal driving the speaker 222. As shown in FIGS. 1A and 1B, voltage/current phase differences are indicative of acoustic impedance, and thus indicative of the position of the speaker 222 relative to the ear of the user. Thus, embodiments of the loudness control circuitry 210 can determine when the speaker 222 is acoustically coupled to the user's ear, and reduce the output sound pressure to a safe level.

Figure 3:
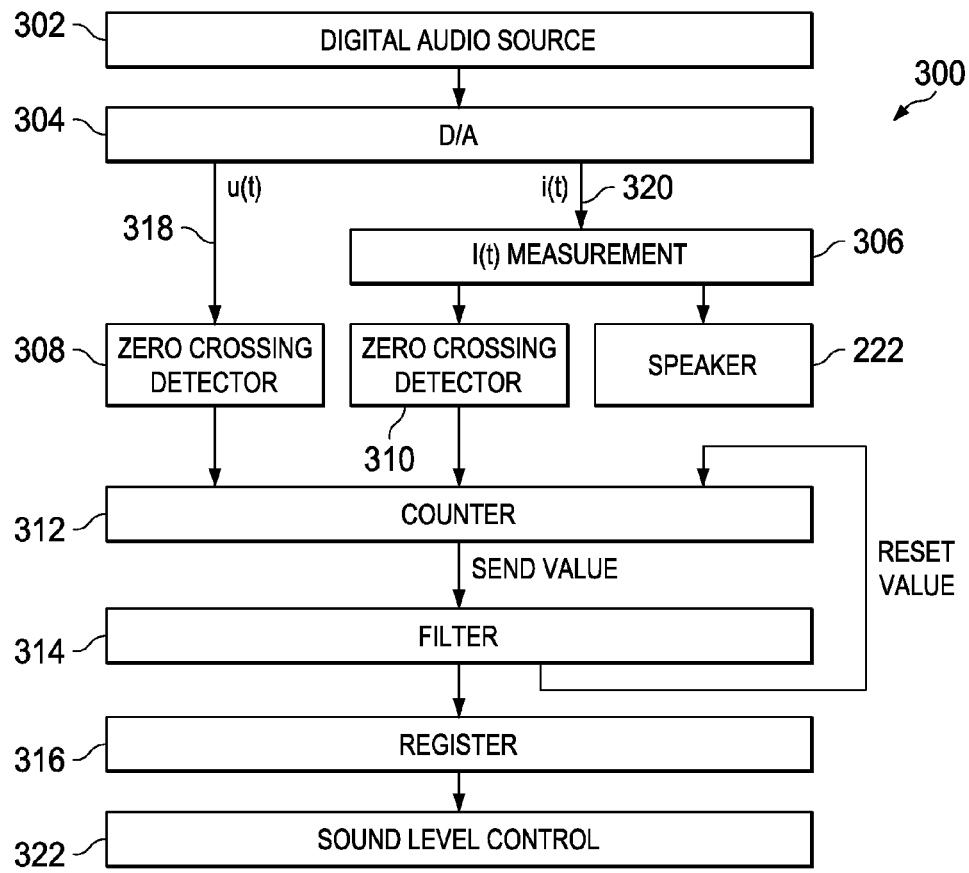
FIG. 3 shows an exemplary block diagram of a phase estimator that provides sound level control in a mobile audio device in accordance with various embodiments.

FIG. 3 shows an exemplary block diagram of a phase estimator 300 that provides sound level control in a mobile audio device 200 in accordance with various embodiments. The phase estimator 300 is preferably included in the loudness control circuitry 210. The phase estimator 300 comprises a digital-to-analog converter ("DAC") 304, zero crossing detectors 308, 310, a counter 312, a filter 314, and a storage register 316.

A digital audio source 302 provides audio samples, for example an audio bitstream, to the DAC 304. The digital audio source 302 can be a down-link receiver of a cellular handset, a decoder that reads sound samples from a storage device, or any other source of digital audio samples. In some embodiments of the phase detector 300, the digital audio source 302 provides a signal tailored to voltage/current phase difference measurement. For example, the digital audio source 302 can provide a calibration tone (e.g., a 6 KHz tone). A predetermined number of cycles of the calibration tone produced at a predetermined amplitude can be provided to the speaker to facilitate voltage/current phase measurement. The calibration tone is preferably produced in a manner making the tone unobjectionable to the user. For example, using psychoacoustic masking effects, a short burst of sound is masked when generated a few milliseconds prior to a following sound.

The DAC 304 converts the digitized audio into an analog signal. A voltage output 318 of the DAC 304 is provided to the zero crossing detector 308. A current output 320 of the DAC 304 is provided to current measurement circuit 306. The current measurement circuit 306 provides drive current to the loudspeaker 222 that generates sound for a user, and provides a signal corresponding to the loudspeaker current to the zero crossing detector 310. The zero crossing detectors 308, 310 identify the points at which the voltage and current signals change polarity (i.e., transition through zero voltage or current). The identified zero points are provided to the counter 312.

The counter 312 determines the time between a zero detection on one of the voltage and current signals and a corresponding zero detection on the other of the voltage and current signals. In some embodiments, the output of the zero crossing detector 308 (i.e., a voltage zero-crossing) starts the counter 312, and the output of the zero crossing detector 310 stops the counter. The counter 312 is preferably clocked at a frequency that provides adequate resolution of the phase difference between the speaker voltage and current. In some embodiments, a 13 MHz clock is provided to the counter 312.

The output of the counter 312, (i.e., the time between voltage and current zero crossings) represents the difference in speaker voltage and current phase. The counter 312 output can be filtered, in some embodiments, to, for example, reject spurious values (e.g., by use of a short median filter). Embodiments store the filtered counter output in a register 316, or other data storage element.

The filtered output is provided to sound level control circuitry that limits the sound pressure level produced by the speaker 222. If, for example, the voltage to current time difference indicates a $\pi/2$ time difference, an embodiment can determine that the speaker sees the impedance of a user's ear, and that speaker 222 sound pressure level should be limited accordingly. If, on the other hand, no delay between voltage and current zero crossings is detected, an embodiment can determine that the speaker is driving free space, and provide a correspondingly higher output sound pressure. Sound pressure levels corresponding to predetermined resolution of voltage/current are stored in pre-computed look-up tables in some embodiments. Some embodiments compute a sound pressure level at run-time based on the voltage/current delay.

Some embodiments of the phase detector 300 can use points on the speaker 222 current and voltage signals other than zero-crossings to measure phase difference. For example, some embodiments may use peak signal values.

In at least some embodiments, various elements of the phase estimator 300, including the DAC 304, the current measurement circuitry 306, the zero-crossing detectors 308, 310, the counter 312, the filter 314, and the storage register 316 can be provided in a single integrated circuit.

Figure 4:
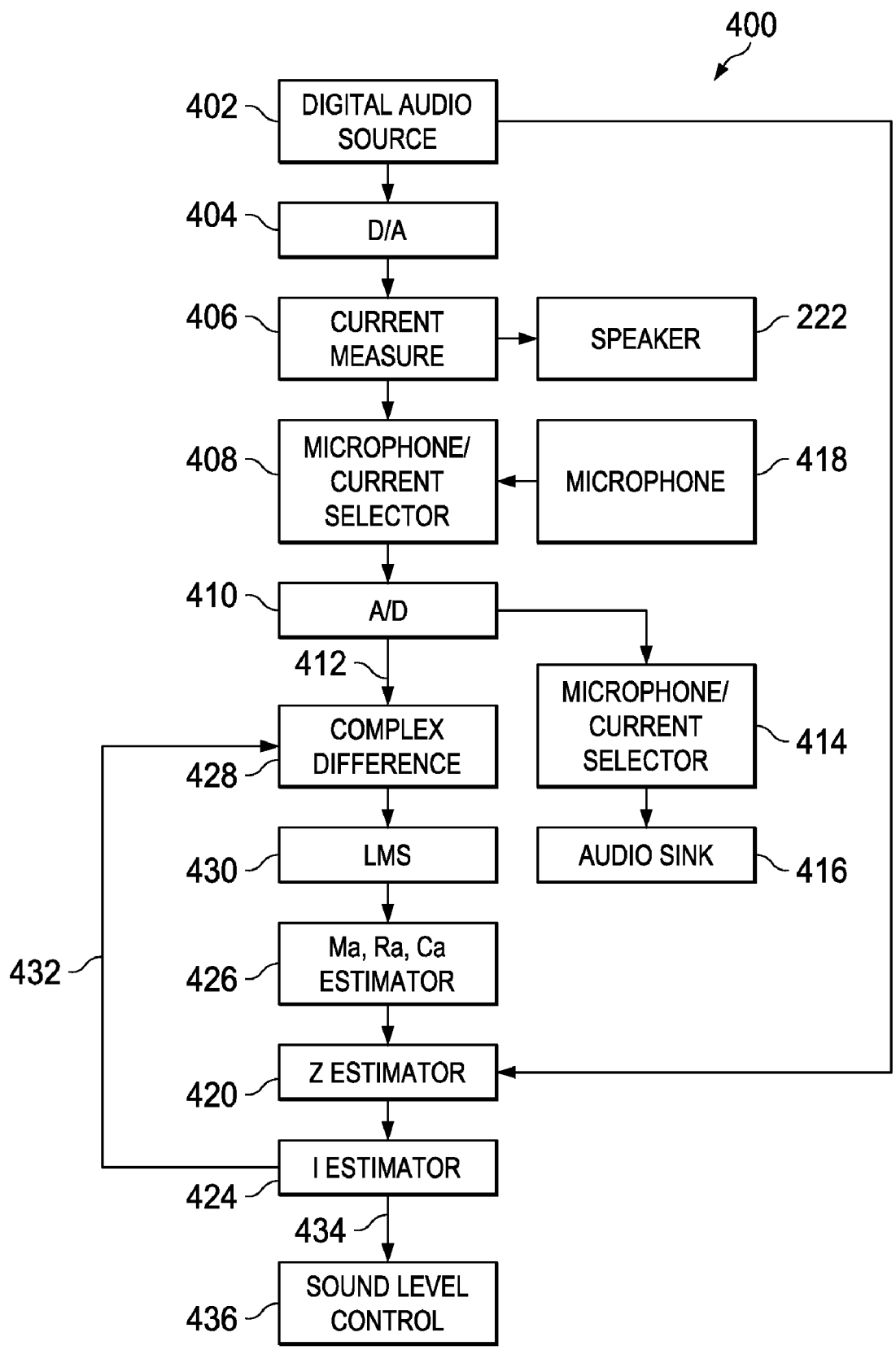
FIG. 4 shows an exemplary block diagram of a phase estimator that provides sound level control in a mobile audio device in accordance with various embodiments.

FIG. 4 shows an exemplary block diagram of a phase estimator 400 that provides sound level control in a mobile audio device 200 in accordance with various embodiments. The phase estimator 400 is preferably included in the loudness control circuitry 210. The phase estimator 400 uses an adaptive algorithm to determine the acoustic impedance parameters of the ear/speaker system model. The acoustic resistance, mass and compliance parameters, $R_A$, $M_A$, and $C_A$, are iteratively refined to reduce error between the measured current and a current estimate produced by processing a speaker voltage in the model.

The phase estimator 400 comprises a digital audio source 402, an acoustic impedance estimator 420, a current estimator 424, a complex differencing module 428, an acoustic parameter correction generation module 430, and an acoustic parameter estimator 426. The digital audio source 402 is similar to the digital audio source 302 described above. The digital audio source 402 provides digital audio samples to both the digital-to-analog convertor ("D/A") 404, and to the acoustic impedance estimator 420. The acoustic impedance estimator 420 provides an estimate of the acoustic impedance seen by the speaker 222. The estimate is based on $R_A$, $M_A$, and $C_A$ estimates provided by the acoustic parameter estimator 426. The acoustic impedance estimator 420 preferable estimates acoustic impedance in accordance with equation (3) above.

The current estimator 424 generates a current estimate 432 (magnitude and phase) based on the acoustic impedance estimate provided by the acoustic impedance estimator 420 and the audio voltage values provided by the digital audio source 402. In at least some embodiments, the current estimator 424 provides a phase difference value 434, indicative of the phase difference between the estimated current 432 and speaker voltage. The sound level control module 436 applies the phase difference value 434 to control the sound pressure level generated by the speaker 222. In some embodiments, the sound level control module 436 estimates the position of the speaker relative to a user's ear in accordance with the phase shifts illustrated in FIG. 1B.

The D/A 404 provides an analog signal to the current measurement circuitry 406, which provides a measurement of the current driving the speaker 222. The current measurements are digitized in analog-to-digital converter ("A/D") 410.

In at least some embodiments, the ADC digitizes both current measurements and audio input signals provided from an audio input source, such as microphone 418. The selector 408 selects an ADC input source in such embodiments. Digitized audio samples can be provided to other system circuitry, such as the audio sink 416, which may be, for example, cellular uplink circuitry, audio storage, etc. The selector 414 selects the audio samples provided to the audio sink 416.

The digitized measured current 412 and the estimated current 432 are provided to a complex difference module 428. The complex differencing module 428 can compute the complex difference of the two currents in various ways. For example, a fast Fourier transform, Hilbert transform, or correlation, can be used depending on the desired precision and complexity. The complex differencing module 428 produces an error value indicative of the in the acoustic resistance, mass and compliance parameters, $R_A$, $M_A$, and $C_A$. The error value is provided to the acoustic parameter correction generation module 430.

The acoustic parameter correction generation module 430 generates correction values to be applied to improve the accuracy of $R_A$, $M_A$, and $C_A$, and thus improve the accuracy of the acoustic impedance estimation. In some embodiments, the acoustic parameter correction generation module 430 can use a least means squares filter to generate correction values. The correction values are fed to the acoustic parameter estimator 426 and used to refine $R_A$, $M_A$, and $C_A$ on a subsequent iteration.

In at least some embodiments, various modules of the phase estimator 400 can be implemented by a processor executing a phase estimator software program stored in a computer readable medium. A suitable processor can be a digital signal processor or other high-performance processor. The components of a processor are well known and can comprise execution units (fixed point, floating point, and/or integer, etc.) instruction decoding, data and instruction storage (registers, memory, etc.), input/output ports (e.g., memory interfaces, serial interfaces, etc.), peripherals (direct memory access controllers, timers, interrupt controllers, communication controllers, etc.), and interconnecting buses. A suitable computer readable medium can comprise semiconductor memory (static or dynamic random access memory, read only memory, etc.), optical storage, magnetic storage, etc. Some embodiments may implement at least some of the acoustic impedance estimator 420, the current estimator 424, the complex differencing module 428, the acoustic parameter correction generation module 430, and the acoustic parameter estimator 426 in software executing on a processor.

Figure 5:
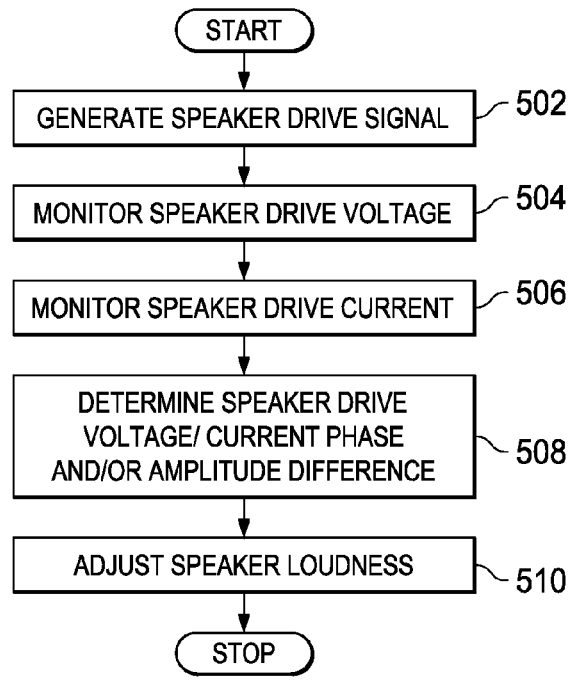
FIG. 5 shows a flow diagram for a method for controlling output sound level in a mobile audio device in accordance with various embodiments.

FIG. 5 shows a flow diagram for a method for controlling output sound level in a mobile audio device 200 in accordance with various embodiments. Though depicted sequentially as a matter of convenience, at least some of the actions shown can be performed in a different order and/or performed in parallel. Additionally, some embodiments may perform only some of the actions shown.

In block 502, a digital audio source 302 in a mobile audio device 200, generates digital audio samples that are converted to a speaker drive signal that actuates a speaker 222. The speaker 222 produces audio for a user. In some embodiments, the samples may compose a calibration signal of predetermined frequency and amplitude.

In block 504, the voltage of the speaker drive signal is monitored to identify a specific point in the signal voltage. In some embodiments, the point may be a zero-crossing identified by the zero-crossing detector 308. Other embodiments may monitor for a different point, for example, a peak value.

In block 506, the current of the speaker drive signal is monitored to identify a specific point in the signal current. In some embodiments, the point may be a zero-crossing identified by the zero crossing detector 310. Other embodiments may monitor for a different point, for example, a peak value.

In block 508, the speaker drive signal voltage/current phase and or amplitude difference is determined. A timer, for example, the counter 312 can determine the voltage/current phase differential by measuring the time between identification of a voltage signal condition (e.g., a zero-crossing) and a corresponding current signal condition (e.g., a zero-crossing).

In block 510, a sound level controller uses the speaker drive signal voltage/current phase difference and/or amplitude difference to adjust speaker 222 loudness. In at least some embodiments, the loudness is adjusted in accordance with a position of the speaker relative to the user's ear in accordance with FIG. 1B.

Figure 6:
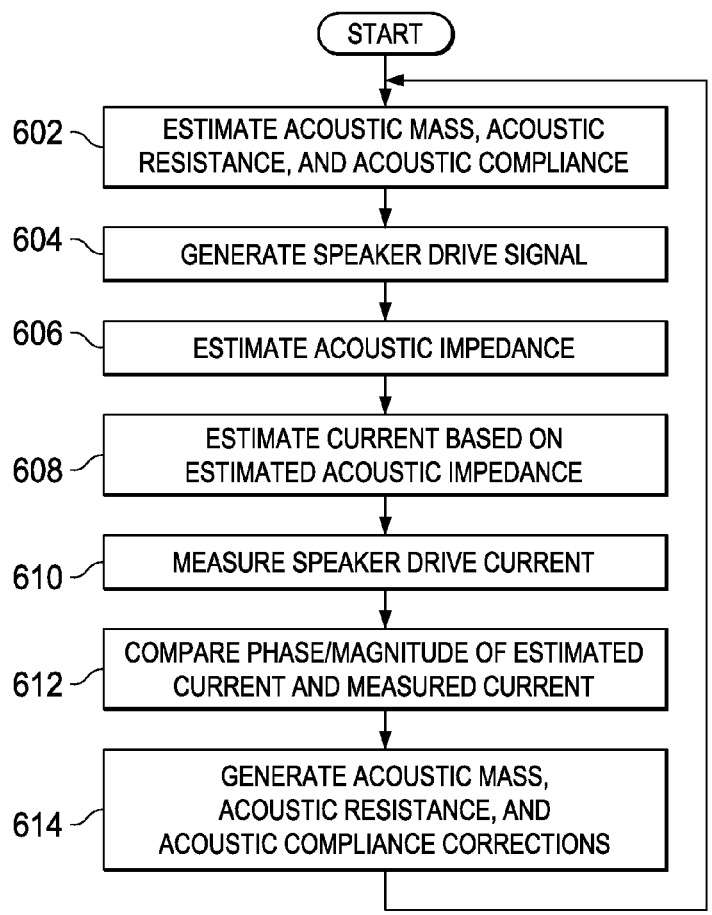
FIG. 6 shows a flow diagram for a method for controlling output sound level in a mobile audio device in accordance with various embodiments.

FIG. 6 shows a flow diagram for a method for controlling output sound level in a mobile audio device 200 in accordance with various embodiments. Some embodiments may implement the actions of FIG. 6 as software programming executed on a processor. Though depicted sequentially as a matter of convenience, at least some of the actions shown can be performed in a different order and/or performed in parallel. Additionally, some embodiments may perform only some of the actions shown.

In block 602, a mobile audio device 200 is providing sound for a user. The loudness of sound produced is controlled based on the acoustic impedance seen by the speaker 222 to protect the user from excessively high sound pressure levels. The acoustic parameter estimator 426 estimates the values of the acoustic parameters: acoustic resistance, $R_A$, acoustic mass, $M_A$, and acoustic compliance, $C_A$ as defined above.

In block 604, a digital audio source 402 in the mobile audio device, generates digital audio samples that are converted to a speaker drive signal that actuates a speaker 222. The speaker 222 produces audio for a user. In some embodiments, the samples may compose a calibration signal of predetermined frequency and amplitude (e.g., 6 KHz in a Blackman window).

In block 606, the acoustic impedance estimator 420 uses the $R_A$, $M_A$, and $C_A$ estimates provided by the acoustic parameter estimator 426 to estimate the acoustic impedance seen by the speaker 222. The acoustic impedance is preferably estimated in accordance with equation (3) above. The acoustic impedance estimate can be used to estimate the position of the speaker 222 relative to the user's ear.

In block 608, the current estimator 424 estimates the current (magnitude and phase) driving the speaker 222 based on the estimated acoustic impedance and the speaker signal voltage provided by the digital audio source 402. The current estimator 424 provides a phase difference value 434, indicative of the phase difference between the estimated current 432 and speaker voltage to the sound level control module 436. The sound level control module 436 applies the phase difference value 434 to control the sound pressure level generated by the speaker 222. In some embodiments, the sound level control module 434 estimates the position of the speaker relative to a user's ear in accordance with the phase shifts illustrated in FIG. 1B.

In block 610, the digital audio samples are converted to an analog signal by the D/A 404, and the speaker 222 drive current is measured in the current measurement circuitry 406. Current measurement methods are well known in the art, and include for example, measuring the voltage drop across a low-valued resistor in a speaker 222 drive conductor. The measured current is preferably digitized in A/D 410.

In block 612, the phase and magnitude of the estimated current is compared to the phase and magnitude of the measured current. The complex differencing module 428 generates a magnitude and phase for the measured current in at least some embodiments. Various methods for generating the complex data including Fourier transforms and Hilbert transforms can be used. Comparison of the measured and estimated currents results in a current error value.

In block 614, the current error value is provided to the acoustic parameter correction generation module 430 where acoustic mass, resistance, and compliance value corrections are generated. Some embodiment may generate the correction values using a least mean squares filter. The correction values are provided to the acoustic parameter estimator 426 for use in generating refined acoustic parameters in subsequent iterations.

The above discussion is meant to be illustrative of the principles and various embodiments of the present invention. Numerous variations and modifications will become apparent to those skilled in the art once the above disclosure is fully appreciated. For example, while embodiments of interface detection have been described in terms of wireless devices, those skilled in the art will recognize that embodiments are also applicable to other devices. It is intended that the following claims be interpreted to embrace all such variations and modifications.

What is claimed is:

1. A system, comprising:
a transducer for converting an electrical signal driving the transducer into audible sound;
a phase estimator for estimating an acoustic impedance of a medium acoustically coupled to the transducer by estimating a phase difference between a voltage and a current of the electrical signal driving the transducer; and
a sound level control for: in response to the estimated acoustic impedance indicating that the medium is an auditory canal, determining that the transducer is aligned with an ear, and protecting a user from an unsafe level of sound pressure by reducing a loudness of a sound produced by the transducer; and, in response to the estimated acoustic impedance indicating that the medium is other than the auditory canal, determining that the transducer is spaced a safe, distance from the ear.

2. The system of claim 1, wherein the phase estimator is for estimating the phase difference by measuring a time difference between: an identified point of the voltage; and a corresponding point of the current.

3. The system of claim 1, wherein the phase estimator includes: a first zero-crossing detector for detecting a zero crossing of the voltage; and a second zero-crossing detector for detecting a zero-crossing of the current.

4. The system of claim 3, wherein the phase estimator includes a counter for measuring an. elapsed time between: one of the zero-crossings of the voltage and the current; and the other of the zero-crossings of the voltage and the current.

5. The system of claim 1, wherein the sound level control is for: in response to the estimated acoustic impedance indicating that the medium is water, determining that the transducer is obstructed.

6. The system of claim 1, wherein the phase estimator is for iteratively estimating the acoustic impedance of the medium acoustically coupled to the transducer.

7. The system of claim 6, wherein the phase estimator is for iteratively estimating an acoustic resistance, acoustic mass, and acoustic compliance of the ear, and the estimated acoustic impedance is based, at least in part, on the estimated acoustic resistance, acoustic mass, and acoustic compliance.

8. The system of claim 7, wherein the phase estimator is for iteratively estimating the acoustic resistance, acoustic mass, and acoustic compliance based, at least in part, on a phase difference between: an estimate of the current based, at least in part, on the estimated acoustic impedance; and a measurement of the current.

9. A method performed by a control system, the method comprising:

estimating an acoustic impedance of a medium acoustically coupled to a speaker by estimating a phase difference between a voltage and a current of an electrical signal driving the speaker;

in response to the estimated acoustic impedance indicating that the medium is an auditory canal, determining that the speaker is aligned with an ear, and protecting a user from an unsafe level of sound pressure by reducing adjusting a loudness of a sound produced by the speaker; and in response to the estimated acoustic impedance indicating that the medium is other than the auditory canal, determining that the speaker is spaced a safe distance from the ear.

10. The method of claim 9, and comprising: in response to the estimated acoustic impedance indicating that the medium is water, determining that the speaker is obstructed.

11. The method of claim 9, wherein estimating the phase difference includes estimating the current based, at least in part, on the estimated acoustic impedance.

12. The method of claim 9, wherein estimating the phase difference includes estimating an acoustic resistance, acoustic mass, and acoustic compliance of the ear.

13. The method of claim 12, wherein estimating the phase difference includes iteratively updating the acoustic resistance, acoustic mass, and acoustic compliance estimate based, at least in part, on a difference between: an estimate of the current derived from the acoustic resistance, acoustic mass, and acoustic compliance; and a measurement of the current.

14. The method of claim 9, wherein estimating the phase difference includes detecting: a prespecified point of the voltage; and a prespecified point of the current.

15. The method of claim 14, wherein estimating the phase difference includes determining a time difference between: the detection of the prespecified point of the voltage; and the detection of the prespecified point of the current.

16. A mobile audio device, comprising:

an audio volume control system for: estimating an acoustic impedance of a medium acoustically coupled to an audio speaker by estimating a phase difference between voltage and a current of an electrical signal driving the audio speaker; in response to the estimated acoustic impedance indicating that the medium is an auditory canal, determining that the audio speaker is aligned with an ear, and protecting a user from an unsafe level of sound pressure by reducing an audio output volume of the audio speaker; and, in response to the estimated acoustic impedance indicating that the medium is other than the auditory canal, determining that the audio speaker is spaced a safe distance from the ear.

17. The mobile audio device of claim 16, wherein the audio volume control system is for: in response to the estimated acoustic impedance indicating that the medium is water, determining that the audio speaker is obstructed.

18. The mobile audio device of claim 16, wherein the audio volume control system includes an audio digital-to-analog converter ("DAC") for estimating the phase difference between the voltage and the current.

19. The mobile audio device of claim 16, wherein the audio volume control system is for reducing the audio output volume to no more than a maximum level of sound pressure specified by a government regulation.

* * * * *